United States Patent [19]

Kinoshita

[11] Patent Number: 5,093,696
[45] Date of Patent: Mar. 3, 1992

[54] SEMICONDUCTOR HETEROJUNCTION DEVICE MADE BY AN EPITAXIAL GROWTH TECHNIQUE

[75] Inventor: Hideaki Kinoshita, Yokohama, Japan

[73] Assignee: Kabushiki Kaisha Toshiba, Kawasaki, Japan

[21] Appl. No.: 589,008

[22] Filed: Sep. 27, 1990

[30] Foreign Application Priority Data

Oct. 2, 1989 [JP] Japan ................ 1-257233

[51] Int. Cl.⁵ .............................................. H01L 33/00
[52] U.S. Cl. .......................................... 357/17; 357/16; 357/55; 372/48; 372/46; 372/45; 372/43; 437/126; 437/130; 359/130
[58] Field of Search .............. 357/17, 16, 55; 372/46, 372/45, 44, 43, 47, 48; 437/126, 130; 350/96.12

[56] References Cited

U.S. PATENT DOCUMENTS

| | | | |
|---|---|---|---|
| 4,818,722 | 4/1989 | Heinen | 357/17 X |
| 4,843,032 | 6/1989 | Tokuda et al. | 357/17 X |
| 4,960,730 | 10/1990 | Kakimoto | 357/17 X |

FOREIGN PATENT DOCUMENTS

| | | |
|---|---|---|
| 0209288A1 | 1/1987 | European Pat. Off. . |
| 0231075A2 | 8/1987 | European Pat. Off. . |
| 0373933A2 | 6/1990 | European Pat. Off. . |
| WO89/07832 | 8/1989 | PCT Int'l Appl. . |

OTHER PUBLICATIONS

Kawakami et al, "GaAs Core Embedded in $Al_xGa_{1-x}As$ Matrix", *Japan J. Appl. Phys.*, vol. 14 (1975), No. 3, pp. 409-411.

*Primary Examiner*—William Mintel
*Attorney, Agent, or Firm*—Finnegan, Henderson, Farabow, Garrett, and Dunner

[57] ABSTRACT

A semiconductor device is disclosed in which an area pattern is formed on a portion of a major surface of a semiconductor substrate over which epitaxial growth layers are formed. In this case, compound semiconductor areas formed by an epitaxial growth method, by the utilization of a surface temperature difference between the major surface of the semiconductor surface and the area pattern in a heating process. By so doing, it is possible to simultaneously obtain the compound semiconductors of a different composition or a different energy gap from each other.

14 Claims, 8 Drawing Sheets

SEMICONDUCTOR HETEROJUNCTION DEVICE MADE BY AN EPITAXIAL GROWTH TECHNIQUE

BACKGROUND OF THE INVENTION

1. Field of the Invention

The present invention relates to a semiconductor device and a method for making the same, and in particular to a semiconductor device including one or more semiconductor layers formed as one or more functional layers on a semiconductor substrate and composed of a compound semiconductor and a method for making the same. The present invention is extensively employed for a functional device including an electronic device such as a diode and transistor, an optical device such as an LED, LD and optical waveguide, and a sensor.

2. Description of the Related Art

Generally, the technique for making a semiconductor layer or layers on a semiconductor substrate is broadly classified into a planer technique principally using the diffusion, ion implantation, oxidation, etc., and an epitaxial growth technique principally using a liquid phase epitaxy (LPE) and vapor phase epitaxy (VPE and CVD). In the formation of a compound semiconductor, in particular, the epitaxial growth technique is employed as a technique for forming semiconductor crystal or mixed crystal layers of a different composition on a semiconductor substrate. This technique has been extensively employed to fabricate an electronic device such as a hetero-bipolar transistor (HBT) and high electron mobility transistor (HEMT), and an optical device such as a light emitting diode (LED), laser diode (LD), photodiode (PD) and optical waveguide, all these devices requiring a hetero-junction structure of a different composition.

The epitaxial growth technique includes, in addition to a liquid phase epitaxy (LPE) method and vapor phase epitaxy (VPE) method using a halogen transport, a metal-organic vapor phase epitaxy (MOVPE) and a molecular beam epitaxy (MBE) method (including an MOMBE method), as capable of a greater material selectivity as well as ready making of a fine structure, an atomic layer epitaxy (ALE) method, a photochemical VPE method using light, as a decomposition energy for a material, in place of heat, and so on.

The conventional semiconductor process technique can readily deposit layers of a different composition on a semiconductor substrate in a direction vertical to the substrate surface, but it has been difficult to deposit layers having a different composition area in a direction parallel to the substrate surface.

Forming a simple optical waveguide on a semiconductor will be explained below by way of example.

Figure 1A:
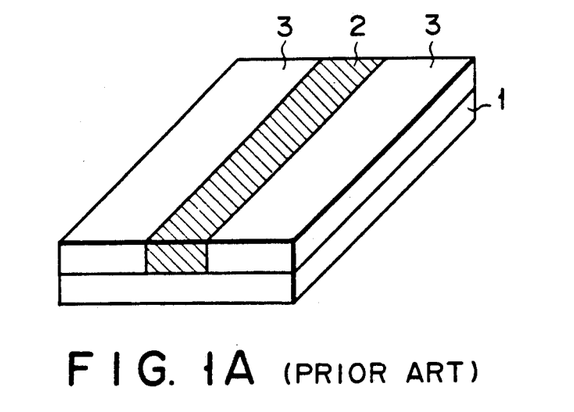
FIGS. 1A to 1C are perspective views showing a conventional optical waveguide.
Figure 1B:
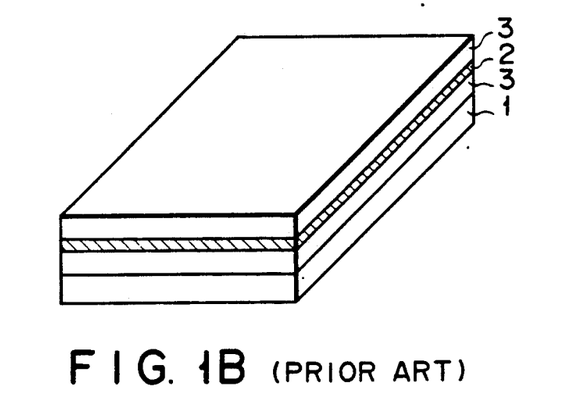
Figure 1C:
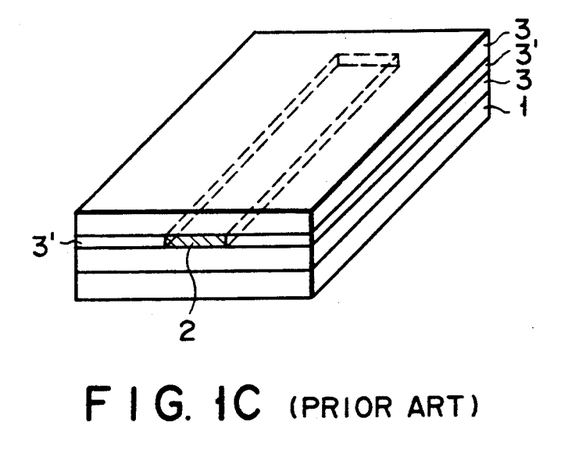

In order to provide an optical waveguide over a semiconductor substrate, a semiconductor area acting as the optical waveguide is formed such that it is surrounded with a clad area of a lower refractive index than that of the semiconductor area. FIGS. 1A to 1C are perspective views showing various forms of an optical waveguide formed on a semiconductor substrate. FIG. 1A is an example in which an optical conducting layer 2 is formed on a substrate 1 such that it is surrounded with cladding layers 3 in a direction parallel to the surface of the substrate. FIG. 1B is an example in which an optical conducting layer 2 is formed on a substrate 1 such that it is surrounded with upper and lower cladding layers 3, in a stacking fashion, in a direction vertical to the surface of the substrate 1. FIG. 1C is an example in which an optical conducting layer 2 and cladding layers 3' are formed as one unit on the surface of a substrate 1 in a direction parallel to the surface of the substrate in which case the unit is sandwiched with cladding layers 3 in that vertical direction except for opposite end faces of the optical conducting layer 2. The structure as shown in FIG. 1C allows light to be conducted to the inner region of the optical conducting layer 2. It will be readily understood that the structure of FIG. 1C is composed of a combination of the structures of FIGS. 1A and 1B.

Usually in the case where an optical waveguide is provided on the substrate with the use of a semiconductor crystal, the following conditions have to be met:

(a) The refractive index of the optical conducting layer, upon being compared with that of the cladding layer, is great enough to confine light therein.

(b) Both the optical conducting layer and cladding layer can be formed as a single crystal on the semiconductor substrate.

As a method for satisfying these conditions (a) and (b), use has usually been made of a mixed crystal of, for example, III - V or II - VI compound semiconductors. This is because the lattice constant and band gap energy (Eg) can be controlled by varying the composition of constituent elements of which the mixed crystal is formed and because the refractive index has a correlation to the band gap energy, that is, an increase in the band gap energy (Eg) leads to a decrease in the refractive index.

The method for the making of a structure as shown in FIGS. 1A and 1B will be explained below in more detail.

The structure of FIG. 1B can readily be made by an epitaxial growth technique for semiconductors, that is, a cladding layer 3, optical conducting layer 2 and cladding layer 3 are sequentially grown over a semiconductor substrate 1 by an epitaxial growth method, such as a liquid phase epitaxy (LPE) or vapor phase epitaxy (VPE). If, at this time, the thickness of these layers has to be exactly controlled on the order of a few μm or below, it is advantageous to employ a molecular beam epitaxy (MBE) or a metalorganic vapor phase epitaxy (MOVPE) method.

On the other hand, the structure of FIG. 1A is made as shown in FIG. 2. That is, an optical conducting layer 2 is grown as a crystal on a semiconductor substrate 1, by the epitaxial growth technique, as shown in FIG. 2A. Then a mask layer, such as an $SiO_2$ film, is patterned, by a photoetching process (PEP), on the optical conducting layer 2 as shown in FIG. 2B and the optical conducting layer 2 is removed, by the etching process, at an area not covered with the mask 4 as shown in FIG. 2C. Cladding layers 3 are selectively grown, by the epitaxial growth technique, on the resultant exposed surface of the semiconductor substrate 1 as shown in FIG. 2C and, finally, the mask 4 on the optical conducting layer 2 is removed to expose the latter as shown in FIG. 2E.

Figure 2A:
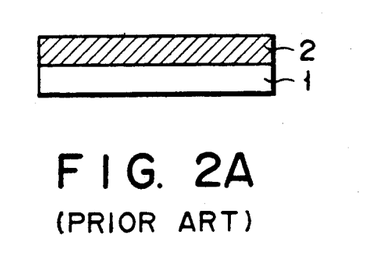
FIGS. 2A to 2E are cross-sectional views showing the steps of making a conventional optical waveguide.
Figure 2B:
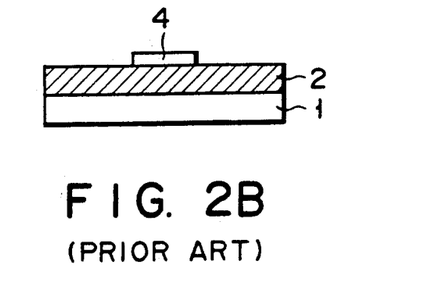
Figure 2C:
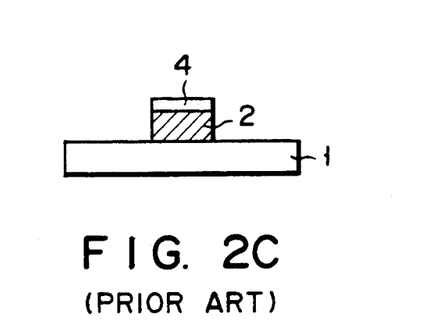
Figure 2D:
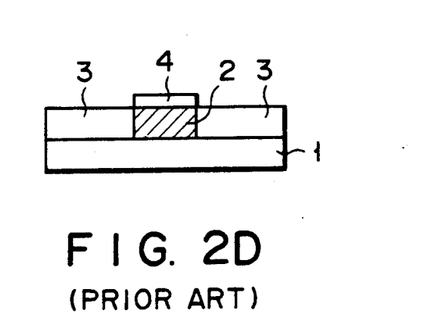
Figure 2E:
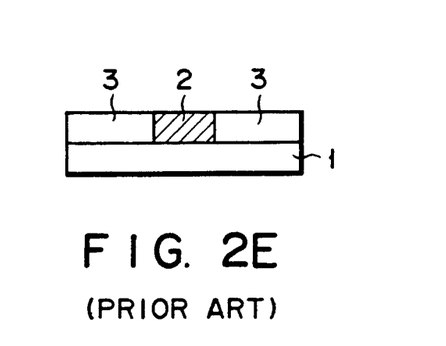

However, the problems as will be set forth below arise in the making of the optical waveguide shown in FIG. 2A. First, the exposed side surfaces of the optical conducting layer 2 are injured or "side etched", by the etching process, during the making step as shown in FIG. 2C, or the exposed surfaces of the optical conducting layer are oxidized depending upon the material used at that process. It is, therefore, difficult to obtain a pure, exposed crystal face. Second, it is usually difficult to obtain flat boundaries relative to the side surfaces of the optical conducting layer 2 during the formation of the cladding layers relative to the optical conducting layer 2 by the selective epitaxial growth as shown in FIG. 2D, that is, to obtain buried cladding layers 3 of a flat boundary relative to the layer 2. To put it in another way, discontinuous surfaces are liable to be produced between the optical conducting layer and the cladding layer. For the reasons as set out above, such discontinuous surfaces and defects occur at the boundaries between the optical conducting layer and the cladding layers 3, thus causing the absorption or scattering of light at the boundaries of the optical waveguide. Third, it is generally difficult to form an epitaxial layer, by a selective epitaxial growth method, on the surface of the mask and remaining surface of the resultant structure, as shown in FIG. 2D, and it is possible to perform such a selective epitaxial growth under the specific conditions only.

Although forming a semiconductor layer of a different crystal composition in the direction parallel to the surface of the substrate has thus far bee explained, as a typical example (FIG. 1A), in connection with the optical waveguide, it is very difficult to employ a conventional process in the formation of such a semiconductor layer.

It is to be noted that the structure of the optical waveguide as shown in FIG. 1C is obtained by a combination of the process methods shown in FIGS. 1A and 1B.

For a semiconductor device in which semiconductor layers are formed as functional layers on a semiconductor substrate, in general, it is easier to sequentially form layers of different compositions on the semiconductor substrate in stacked fashion as shown in FIG. 1B, but it becomes very difficult to form such layers of different crystal compositions in a lateral direction, that is, in a direction parallel to a substrate surface as shown in FIG. 1A. The aforementioned wafer process often includes, for example, a selective etching and selective epitaxial growth process. Further, the semiconductor layers as stacked in a complex process over the semiconductor substrate contain discontinuous surfaces or crystal defects which are liable to occur at the boundaries between these layers of different crystal compositions. This is a cause for the degraded characteristics of a semiconductor device obtained.

SUMMARY OF THE INVENTION

It is accordingly an object of the present invention to provide a method for making a semiconductor layer or layers of less crystal defect which can readily deposit adjacent layer areas of a different crystal composition in a direction parallel to a substrate surface.

Another object of the present invention is to provide a laser diode which can readily form a window structure, by the aforementioned method, capable of suppressing a catastrophic optical damage (COD).

According to the present invention, there is provided a method for making a semiconductor device in which semiconductor layers of a different band gap and/or a different composition are formed by an epitaxial growth technique on first and second areas formed adjacent the semiconductor surfaces, said method comprising the steps of:

forming, adjacent a first area, a second area of a different composition or different electrical conduction, said first area being a portion of a major surface of a semiconductor substrate, to make the first and second area have a different surface temperature each at a heating step of a subsequent epitaxial growth process; and deposing, by the epitaxial growth technique on exposed surfaces of the first and second areas, compound semiconductor layers of a different band gap energy and/or a different composition each, while being lattice-matched to both the areas.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

It has been known that when, of compound semiconductor materials, a III-V ternary compound such as InGaP or a III-V quaternary compound such as InGaAlP is grown by a vapor phase growth method, such as an MOVPE, on a semiconductor substrate such as GaAs, a different crystal structure or different crystal composition layer is formed depending upon growth conditions, such as the growth temperature, growth pressure, doping and so on.

Figure 11:
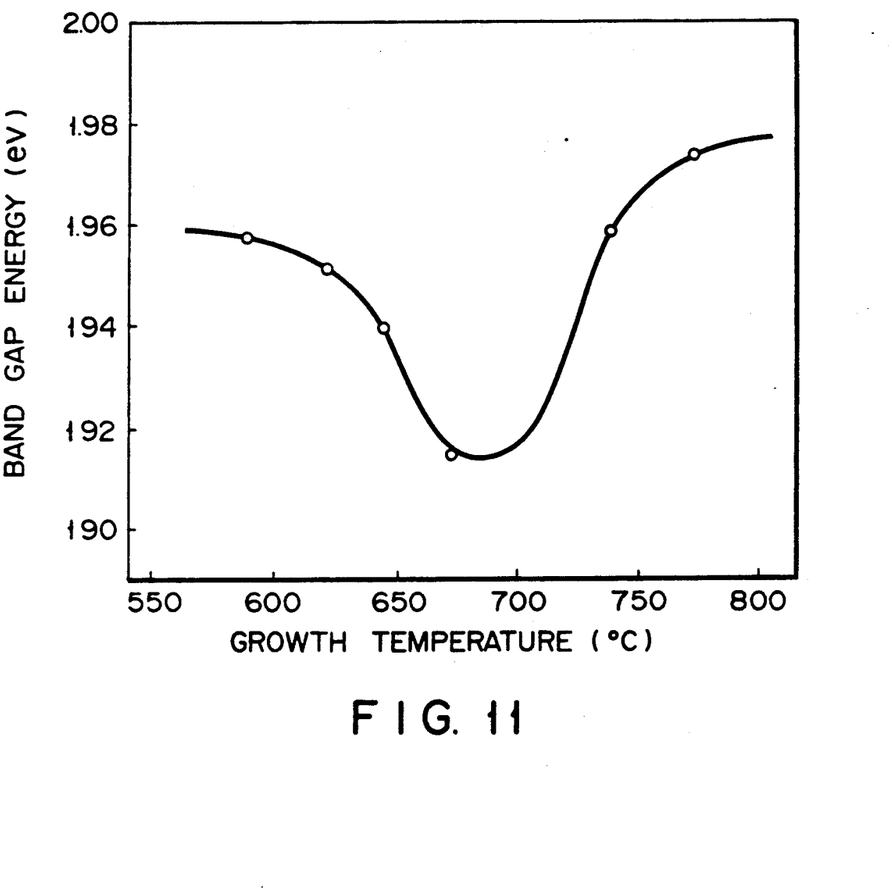
FIGS. 11 and 12, each, are a characteristic curve showing a band gap energy to a growth temperature dependency relation of InGaP.

FIG. 11 shows a growth temperature dependence, upon a band gap energy (Eg), of $In_{0.5}Ga_{0.5}P$ grown as a crystal layer on a (100) GaAs substrate by an MOVPE method.

Figure 12:
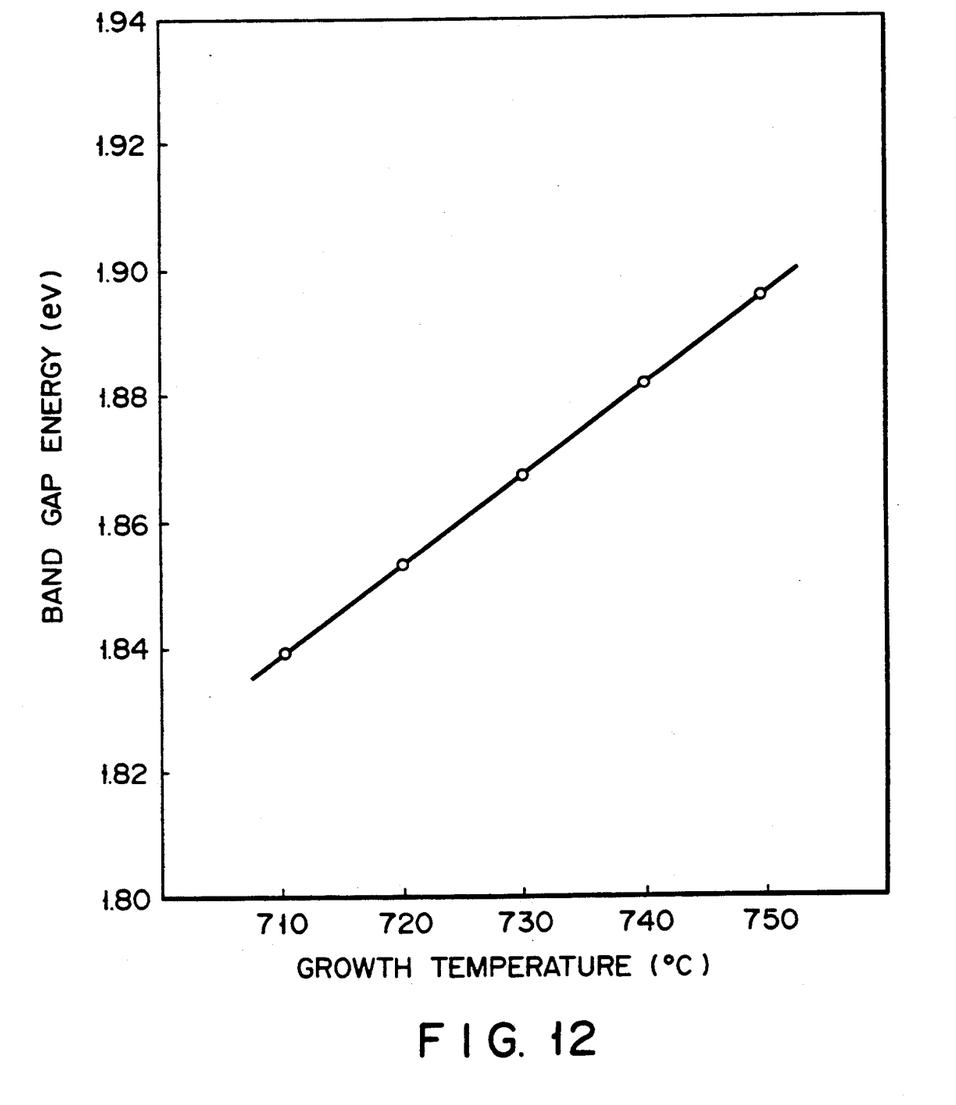

From a graph of FIG. 11 it will be seen that the band gap energy (Ep) of $In_{0.5}Ga_{0.5}P$ varies to an extent of about 0.05 eV at a growth temperature of 650° C. to 750° C. Further, even if a feed supply rate is fixed in a crystal growth of InGaP, a resultant mixed crystal varies in composition depending upon the growth temperature, that is, the higher the growth temperature, the greater the value of $In_{1-x}Ga_xP$ and hence the band gap energy (Eg). FIG. 11 shows a variation of the band gap energy (Eg) for the same composition, that is, $In_{0.5}Ga_{0.5}P$, but an amount of variation of Eg against the growth temperature is further increased, considered together with an effect of a variation of the mixed crystal's composition by the growth temperature. FIG. 12 is a graph showing the temperature dependence of Eg for $In_{0.5}Ga_{0.5}P$ actually prepared by a low pressure MOVPE method, the effect including a lattice mismatching effect resulting from the growth temperature. It is to be noted that the band gap energy Eg is a value determined by a photoluminescence measurement.

On the other hand, it has been found that, when a semiconductor substrate, such as GaAs, is heated during a vapor phase growth process such as an MOVPE, the substrate surface's temperature varies depending upon the electric conductivity as well as the material of which the semiconductor substrate is formed. In actual practice, when an epitaxial layer is grown by the vacuum.

MOVPE method on a (100) GaAs substrate 350 μm thick, then it is so formed as to have an area of different crystal composition and different band gap energy (Eg) in accordance with a substrate surface's temperature difference at that time.

According to the present invention it is possible to form those areas of different crystal composition and different band gap energy by giving a temperature difference to the substrate surface at different areas.

A semiconductor device according to a first embodiment of the present invention will be explained below in connection with an optical waveguide as an example.

Figure 3:
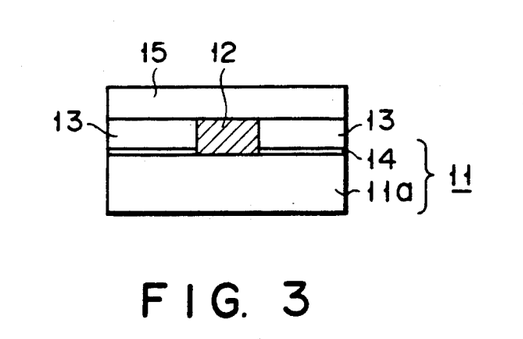
FIG. 3 is a cross-sectional view showing an optical waveguide according to a first embodiment of the present invention.

FIG. 3 is cross-sectional view showing a modeled optical waveguide in the embodiment of the present invention. In FIG. 3, a semiconductor substrate 11 is composed of an n-type GaAs substrate 11a and crystal growth layer 14 formed on the substrate 11a at a given area.

An optical conducting layer 12 is formed, as a first epitaxial layer of InGaP, on the exposed surface of an n type GaAs substrate at an area (first region) not covered with the crystal growth layer 14. Cladding layers 13 are formed, as second epitaxial layer of InGaP, on the exposed surface of the crystal growth layer (second area) 14. A cap layer 15 which is formed over the optical conducting layer 12 and cladding layers 3 is formed of a material, such as GaAlAs, GaAs, which can be grown without depending upon the surface temperature. The crystal growth layer 14 is formed of, for example, GaAlAs, InGaAlP or ZnSe, which is lattice-matched to GaAs and $In_{0.5}Ga_{0.5}P$, and can be formed as a thin insulating layer if a lattice matching is obtained.

Figure 4A:
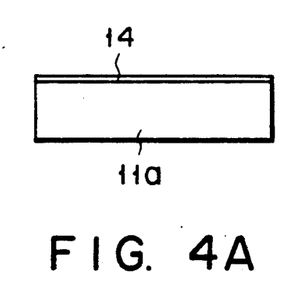
FIGS. 4A to 4C are cross-sectional views showing the steps of making an optical waveguide as shown in FIG. 3.
Figure 4B:
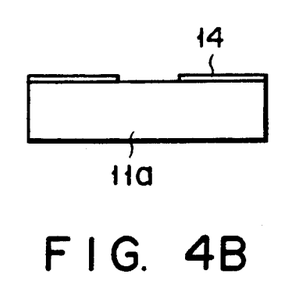
Figure 4C:
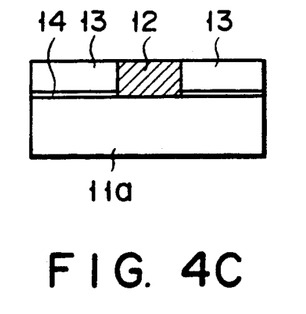

FIGS. 4A, 4B, and 4C are cross-sectional views showing making steps of an optical waveguide according to the first embodiment of the present invention. As shown in FIG. 4A, a thin InGaAlP crystal growth layer 14 of above 0.1 μm is formed by an MOVPE method on an n-type GaAs substrate 11a. Then the growth layer 14 is partially removed by a PEP technique to expose the GaAs substrate 11A at selected areas as shown in FIG. 4B. As shown in FIG. 4C, InGaP layers 12 and 13 are grown, as a crystal layer of 0.5 to a few μm thick, on the substrate, by virtue of the MOVPE method, under the same condition using a reaction gas at a feed supply rate $In_{0.5}/Ga_{0.5}/P$. At that time, the surface temperature of the crystal growth layer 14 becomes a higher level than that of the n type GaAs substrate 11a owing to a difference in composition between the n type GaAs substrate 11a and InGaAlP crystal growth layer 14. The surface temperature difference is maintained during the layer growth because an upper layer being grown is relatively thin. In spite of the fact that the layers 12 and 13 are grown over the semiconductor substrate under the same growth conditions, they are formed as growth layers of different Eg and crystal composition resulting from their surface temperature difference, that is, the InGaP layer 12 grown on the n type GaAs substrate 11a is made smaller in Eg, and greater in refractivity, than the layers 13 grown on the crystal growth layer 14. Subsequent to forming the InGaP layer 12 and 13 of a predetermined thickness over the substrate, an epitaxial GaAlAs layer 15 is formed as a cap layer of a few μm to several tens of μm on the resultant structure by means of an MOVPE method to provide an optical waveguide as shown in FIG. 3.

The present embodiment is directed to selectively forming a semiconductor layer on a substrate with their compositions made different from each other and forming upper semiconductor layers of different Eg and composition, utilizing a surface temperature difference between an area covered with the semiconductor layer and an area not covered with the semiconductor layer.

Figure 5:
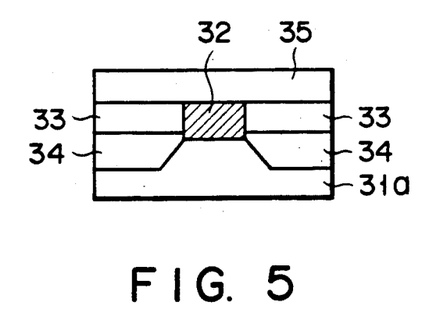
FIG. 5 is a cross-sectional view showing an optical waveguide according to a second embodiment of the present invention.

FIG. 5 is a cross-sectional view showing a model of an optical waveguide according to a second embodiment of the present invention. In FIG. 5, an n-type GaAs substrate 31a has a mesa-like projection and GaAs crystal growth layers 34 of high resistance are buried in the mesa-like recess of the substrate. The crystal growth layer 34 may be of such a type as to have a high resistance layers or a different electric conductivity from that of a substrate 31a, such as p type GaAs, or is formed of a different material from that of a substrate 31a, such as GaAlAs, InGaAlP or ZnSe. In the present embodiment, a liquid phase epitaxy (LPE) method is employed to obtain a planarized substrate surface in which case it is desirable to use a material for LPE. First and second epitaxial layers 32 and 33 of InGaP are formed on the exposed surface of the substrate 31a and crystal growth layer 34, respectively. A cap layer 35 of GaAlAs (or GaAs) is formed on the epitaxial layers 32 and 33.

Figure 6A:
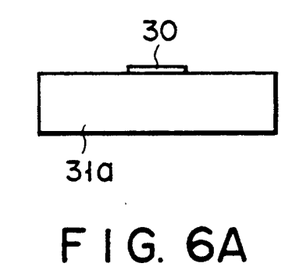
FIGS. 6A to 6E are cross-sectional views showing the steps of making the optical waveguide shown in FIG. 5.
Figure 6B:
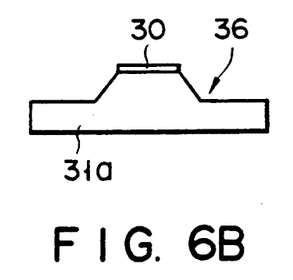
Figure 6C:
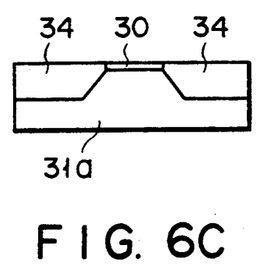

FIGS. 6A–6E are cross-sectional views showing the making steps of an optical waveguide according to the second embodiment of the present invention. As shown in FIG. 6A, a mask 30, such as an $SiO_2$ film, is formed on the portion of an n type GaAs substrate 31a and, as shown in FIG. 6B, the GaAs substrate 31a is removed, by the PEP technique, at an area not covered with the mask 30, to are extent of about 0.5 to 1 μm to provide mesa-like recesses 36. Then high resistance GaAs layers 34, are buried, in the mesa-like recess, by a selective liquid phase epitaxy method, as shown in FIG. 6C. The layers 34 may be formed of GaAlAs, InGaAlP or ZnSe.

Figure 6D:
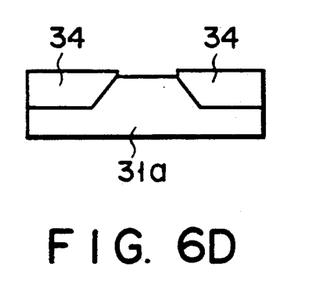
Figure 6E:
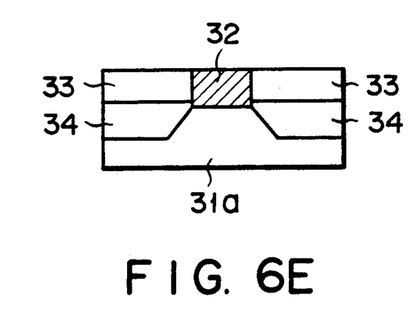

Then the mask 30 is etched away as shown in FIG. 6D and InGaP layers 32 and 33 are grown, by the MOVPE method, on the resultant structure, as shown in FIG. 6E, under the same growth conditions using a reaction gas at a molar ratio $In_{0.5}/Ga_{0.5}/P$.

It has been observed that, when an n-type Si-doped GaAs substrate of a carrier concentration $2\times10^{18}$ to $4\times10^{18}$ cm$^{-3}$ and resistivity of $2\times10^{-3}$ Ωcm, as well as semi-insulating, Cr-doped GaAs substrate of a resistivity $4\times10^{18}$ to $7\times10^{8}$ Ωcm, is placed on a susceptor heated to about 720° C. in a carrier gas H$_2$ atmosphere, the surface temperature of the semi-insulating substrate is about 20° to 30° C. higher than that of the n type GaAs substrate. It has also been found that, upon comparing the aforementioned GaAs substrate covered with a 50 Å $In_{0.5}Ca_{0.5}P$ layer and that not covered with the latter layer, the covered one is about 10° to 15° C. higher in its surface temperature under the same conditions than the one not covered with the $In_{0.5}Ga_{0.5}P$ layer. Thus the exposed surface (first area) of the mesa-like substrate 31a is lower in its surface temperature than the grown crystal layers (second areas) 34. Therefore, the epitaxial layer 32 deposited on the exposed surface of the substrate 31a is made lower in Eg, and greater in light refractive index, than the epitaxial layers 33 deposited on the exposed surface of the crystal growth layer 34.

Then the cap layer 35 of GaAlAs is formed on the layers 32 and 33 to provide a device as shown in FIG. 5.

This embodiment is directed to an example epitaxial growth layers of a different Eg are obtained due to a surface temperature difference relative to the substrate by forming mesa-like recess on the portion of the semiconductor substrate, burying the mesa-like recess with a material different in composition or in electric conductivity from the semiconductor substrate and forming the InGaP or InGaAlP layers on the corresponding exposed surface under the same conditions as set forth below.

Figure 7:
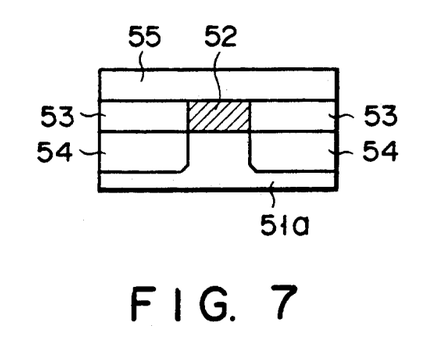
FIG. 7 is a cross-sectional view showing an optical waveguide according to a third embodiment of the present invention.
Figure 8A:
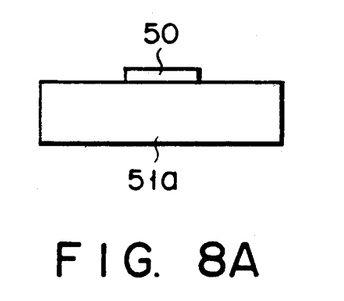
FIGS. 8A to 8D are cross-sectional views showing the steps of making the optical waveguide shown in FIG. 7.
Figure 8B:
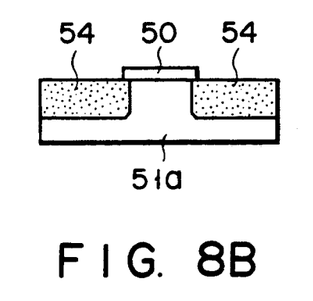
Figure 8C:
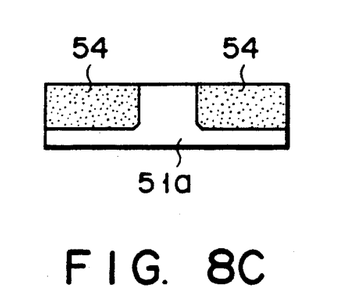
Figure 8D:
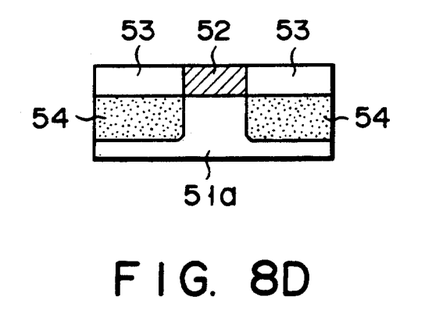

FIG. 7 is a cross-sectional view showing a model of an optical waveguide according to a third embodiment of the present invention and FIGS. 8A–8D are cross-sectional views showing a making method of the optical waveguide shown in FIG. 7. As shown in FIG. 8A, a mask 50, such as an SiO$_2$ film, is formed on a corresponding portion of an n type, (100) GaAs substrate 51a. Then as shown in FIG. 8B a proton (H$^+$) is implanted into the substrate at those areas not covered with the mask 50 to provide high resistance layers 54. The mask 50 is removed as shown in FIG. 8C and InGaP layers 52 and 53 are grown as crystal layers or the resultant structure by means of an MOVPE method under the same growth conditions using a reaction gas at a molar ratio of $In_{0.5}/Ga_{0.5}/P$—FIG. 8D. A cap layer 55 of GaAlAs (or GaAs) is formed on the layers 52 and 53 to obtain a optical waveguide as shown in FIG. 7.

Even in this embodiment, a surface temperature difference exists between the exposed surface of the n type GaAs substrate 51a and that of the high resistance layer 54 and, therefore, the InGaP epitaxial layers 52 and 53 over the underlying structure are different in Eg from each other.

Although, in the first to third embodiments as set out above, $In_xGa_{1-x}P$ layers have been explained as being grown as the first and second epitaxial layers on the GaAs substrate, the same result is also obtained even when $In_{1-y}(Ga_{1-x}Al_x)_yP$ layers are formed in place of the $In_xGa_{1-x}P$ layers. For a multi-layer structure composed of a combination of mixed crystals $In_xGa_{1-x}P$ and $In_{1-y}(Ga_{1-x}Al_x)_yP$, the same result as set out above in connection with the preceding embodiment is obtained for the respective layers.

As the material for the n type GaAs substrate (11a, 31a, 51a) of the first to third embodiments, use may be made of a material for allowing $In_xGa_{1-x}P$ and $In_{1-y}(Ga_{1-x}Al_x)_yP$ to be epitaxially grown, such as $Ga_{1-x}Al_xAs$, $GaAs_xP_{1-x}$, ZnSe, $ZnS_{1-x}Se_x$, Si, GaP, ZnS and InP.

For the semiconductor material other than InGaP and InGaAlP, the present invention can be applied to a material of such a nature as to allow its Eg or its crystal composition to vary in accordance with the substrate surface temperature at a time of epitaxial growth. The present invention is not restricted to the aforementioned layer thickness.

In order to relax a lattice mismatching between the exposed surfaces of the first and second areas of the substrate on one hand and the overlying epitaxial layers on the other hand, an underlying layer, such as a semiconductor or other proper material, can be interposed at that in-between area. In this connection it is to be noted that the underlying layer needs to have such a thickness as to create a desired temperature difference, that is, a temperature difference necessary to form epitaxial layers of a different Eg or different crystal composition.

Figure 9:
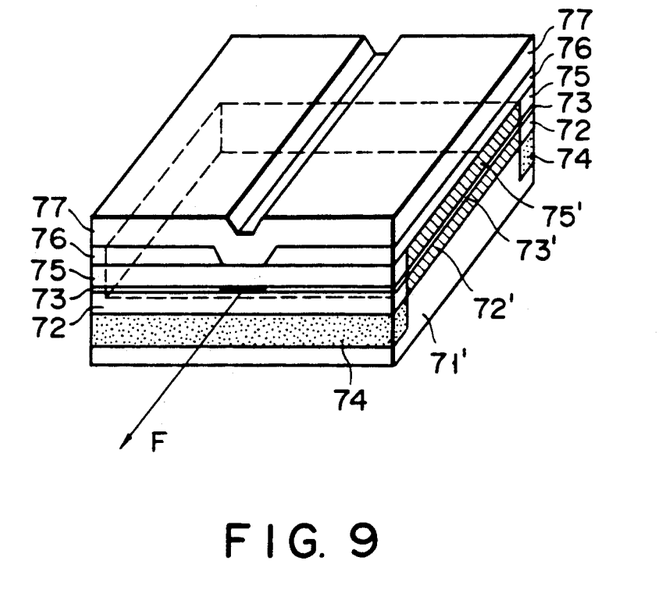
FIG. 9 is a perspective view showing a laser diode according to a fourth embodiment of the present invention.
Figure 10:
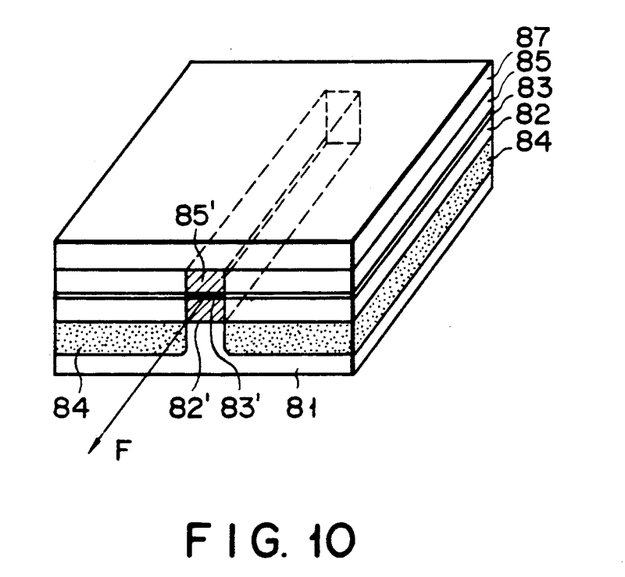
FIG. 10 is a perspective view showing a laser diode according to a fifth embodiment of the present invention.

Applying the present invention to a laser diode will be explained below with reference with FIGS. 9 and 10. FIGS. 9 and 10 are perspective views showing fourth and fifth embodiments of the present invention, respectively. In these embodiments, a visible laser diode is shown which uses a double hetero-structure as an InGaP structure or an InGaAlP structure.

FIG. 9 shows an inner-strip (IS) laser diode of 670 nm band, comprising an n type GaAs substrate 71'; n type $In_{0.5}(Ga_{0.5}Al_{0.5})_{0.5}P$ cladding layers 72, 72'; undoped $In_{0.5}Ga_{0.5}P$ active layers 73, 73'; p type $In_{0.5}(Ga_{0.5}Al_{0.5})_{0.5}P$ cladding layers 75, 75'; an n type GaAs current block layer 76; and a p type GaAs ohmic contact layer 77. In FIG. 9, the solid (black) areas indicate a laser emission plane and a laser beam is emitted in a direction as indicated by an arrow F in FIG. 9. When a high resistance area 74 is formed near the laser beam emission end face of the n type GaAs substrate, the n type cladding layer, active layer and p type cladding layer are grown over the underlying structure under a surface temperature difference between the substrate 71 and the high area 74 and, at the same time, are divided into those layers of a greater Eg and those layers of a smaller Eg in accordance with the high resistance area pattern on the substrate. Although the layers 73, 73' and layers 75, 75' are not in direct contact with the substrate 71 and high resistance area 4, the surface temperature difference is maintained because these interposing layers are very thin relative to the substrate. It is thus possible to grow these layers 73 and 73' and 75 and 75' of different Eg in a side-by-side relation. The layers of a greater Eg are formed near the laser beam emission end face of the device and are transparent to a laser beam of the inner layer of a smaller Eg. Thus a "window" structure can readily be provided which inhibits a catastrophic optical damage (COD) at the laser beam emission end face of the device.

The laser diode of the fifth embodiment as shown in FIG. 10 comprises a p type GaAs substrate 81; p type $In_{0.5}(Ga_{0.5}Al_{0.5})_{0.5}P$ cladding layers 82, 82'; undoped $In_{0.5}Ga_{0.5}P$ active layers 83, 83'; n type $In_{0.5}(Ga_{0.5}Al_{0.5})_{0.5}P$ cladding layers 85, 85'; and an n type GaAs ohmic contact layer 87 in which case high resistance areas 84 are provided in the p type GaAs substrate 81 as shown in FIG. 10. By so doing, the p type cladding layer 82', active layer 83' and n type cladding layer 85' corresponding to a current injection area of a double hetero-structure have their Eg reduced relative to the surrounding structure. Stated in another way, the device is of a horizontal light conduction type as shown in FIG. 3 such that, relative to the light emission area at the current injection area and active layer, a surrounding area is made to have a small refractive index. It is, therefore, possible to effectively confine light emitted at the active layer. Since, in the fifth embodiment, the high resistance areas 84 on the substrate 81 serve also as current block layers, the present embodiment is advantageous in that it is simpler to construct and manufacture. From the above it will be appreciated that it is possible to readily obtain a laser diode from a combination of the fourth and fifth embodiments.

Additional advantages and modifications will readily occur to those skilled in the art. Therefore, the invention in its broader aspects is not limited to the specific details, representative devices, and illustrated examples shown and described herein Accordingly, various modifications may be made without departing from the spirit or scope of the general inventive concept as defined by the appended claims and their equivalents.

What is claimed is:

1. A semiconductor device comprising:
   a semiconductor body comprising a first portion and a second portion, the first portion having a composition on a portion of a major surface of a semiconductor substrate, and the second portion having a composition different from said composition of said first portion adjacent to the first portion; and
   an epitaxial semiconductor layer comprising a first portion and a second portion, the first portion being on said first portion of the semiconductor body, and the second portion of the epitaxial layer being on said second portion of the semiconductor body, the first portion and the second portions of the epitaxial layer having different band gap energies from each other.

2. The semiconductor device according to claim 1, wherein said second portion of the epitaxial semiconductor layer is the remnant of another epitaxial semiconductor layer on the major surface of said semiconductor substrate and partially photoetched from said major surface portion of the semiconductor substrate.

3. The semiconductor device according to claim 1, wherein said epitaxial semiconductor layer has properties characteristic of molecular beam epitaxy.

4. The semiconductor device according to claim 1, wherein said second portion of the semiconductor body is a buried layer having a different composition from said first portion of the semiconductor body.

5. The semiconductor device according to claim 1, wherein said second portion of the semiconductor body is a resistance layer including implanted protons in the major surface portion of said semiconductor substrate.

6. The semiconductor device according to any one of claims 1 to 5, wherein said semiconductor substrate is essentially a material selected from the group consisting of GaAs, GaAlAs, GaAsP, ZnSe, $AnS_{1-x}Se_x$, Si, GaP, ZnS and InP.

7. The smeiconductor device according to claim 6, wherein said epitaxial semiconductor layer consists essentially of $In_y(Ga_xAl_{1-x})P_{1-y}$ in which $0 \leq x \leq 1$ and $0 \leq y \leq 1$.

8. The semiconductor device according to any one of claims 1 to 5, wherein said semiconductor substrate consists essentially of GaAs and said epitaxial semiconductor layer consists essentially of InGaP.

9. An inner strip type laser diode having an n type cladding layer, an active layer, a p type cladding layer, an n type blocking layer and a p type contact layer on an n type semiconductor substrate, said laser diode comprising a resistance portion provided on at least one end portion of the n type semiconductor substrate and a window structure of a bandgap energy, said window structure being provided by an end face of said n type cladding layer, said active layer and said p type cladding layer being epitaxial layers on said resistance portion.

10. The laser diode according to claim 9, wherein said n type semiconductor substrate is an n type GaAs substrate,
    said n type cladding layer is an n type $In_{0.5}(Ga_{0.5}Al_{0.5})_{0.5}P$ cladding layer,
    said active layer is an undoped $In_{0.5}Ga_{0.5}P$ active layer,
    said p type cladding layer is a p type $In_{0.5}(Ga_{0.5}Al_{0.5})_{0.5}P$ cladding layer,
    said n type blocking layer is an n type GaAs current blocking layer, and
    said p type contact layer is a p type GaAs ohmic contact layer.

11. A laser diode comprising:
    a p type cladding layer, an active layer, an n type cladding layer and an n type contact layer deposited over a p type semiconductor substrate, said laser diode including a resistance portion formed on the p type semiconductor substrate and serving as a current blocking layer and a portion formed on said resistance portion and having a smaller bandgap energy than a corresponding bandgap energy of the p type cladding layer, the active layer and the n type cladding layer.

12. The laser diode according to claim 11, wherein said p type semiconductor substrate is a p type GaAs substrate,
    said p type cladding layer is a p type $In_{0.5}(Ga_{0.5}Al_{0.5})_{0.5}P$ cladding layer,
    said active layer is an undoped $In_{0.5}(Ga_{0.5}Al_{0.5})_{0.5}P$ cladding layer,
    said n type cladding layer is an n type $In_{0.5}(Ga_{0.5}Al_{0.5})_{0.5}P$ cladding layer, and
    said n type contact layer is an n type GaAs ohmic contact layer.

13. An inner strip type laser diode having an n type cladding layer, an active layer, a p type cladding layer, an n type blocking layer and a p type contact layer on an n type semiconductor substrate, wherein
    said laser diode comprises a resistance portion on at least one end portion of the n type semiconductor substrate and a window structure which is provided by an end face of said n type cladding layer, said window structure having a bandgap energy,
    said active layer and said p type cladding layer are epitaxial layers on said resistance portion,
    said n type semiconductor substrate is an n type GaAs substrate, said n type cladding layer is an n type $In_{0.5}(Ga_{0.5}Al_{0.5})_{0.5}P$ cladding layer, said active layer is an undoped $In_{0.5}Ga_{0.5}P$ active layer, said p type cladding is a p type $In_{0.5})Ga_{0.5}Al_{0.5})_{0.5}P$ cladding layer, said n type blocking layer is an n type GaAs current blocking layer, and said p type contact layer is a p type GaAs ohmic contact layer.

14. A laser diode comprising:

a p type cladding layer, an active layer, an n type cladding layer and an n type contact layer on a p type semiconductor substrate, wherein said laser diode includes a resistance portion on the p type semiconductor substrate and serving as a current blocking layer and a portion on said resistance portion and having a smaller bandgap energy than a corresponding bandgap energy of the p type cladding layer, the active layer and the n type cladding layer, said p type semiconductor substrate is a p type GaAs substrate, said p type cladding layer is a p type $In_{0.5}(Ga_{0.5}Al_{0.5})_{0.5}P$ cladding layer, said active layer is an undoped $In_{0.5}(Ga_{0.5}Al_{0.5})_{0.5}P$ cladding layer, said n type cladding layer is an n type $In_{0.5}(Ga_{0.5}Al_{0.5})_{0.5}P$ cladding layer, and said n type contact layer is an n type GaAs ohmic contact layer.

* * * * *

UNITED STATES PATENT AND TRADEMARK OFFICE
CERTIFICATE OF CORRECTION

PATENT NO. : 5,093,696
DATED : March 3, 1992
INVENTOR(S) : Hideaki KINOSHITA It is certified that error appears in the above-identified patent and that said Letters Patent is hereby corrected as shown below:

Claim 7, column 10, line 1, change "smeiconductor" to --semiconductor--.

Claim 13, column 11, line 5, after "cladding" insert --layer--.

Claim 13, column 11, line 5, change ")Ga" to --(Ga--.

Signed and Sealed this

Nineteenth Day of July, 1994

Attest:

BRUCE LEHMAN

Attesting Officer    Commissioner of Patents and Trademarks